(12) United States Patent  
Yu et al.

(10) Patent No.: US 8,597,962 B2  
(45) Date of Patent: Dec. 3, 2013

(54) VERTICAL STRUCTURE LED CURRENT SPREADING BY IMPLANTED REGIONS

(75) Inventors: San Yu, Westford, MA (US); Chi-Chun Chen, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 265 days.

(21) Appl. No.: 13/074,137

(22) Filed: Mar. 29, 2011

(65) Prior Publication Data

US 2011/0244616 A1 Oct. 6, 2011

Related U.S. Application Data

(60) Provisional application No. 61/319,425, filed on Mar. 31, 2010.

(51) Int. Cl.  
*H01L 21/00* (2006.01)  
*H01L 51/40* (2006.01)

(52) U.S. Cl.  
USPC .......... 438/22; 438/34; 438/45; 438/69; 438/82; 257/E21.043; 257/E21.046; 257/E21.057; 257/E21.085; 257/E21.217

(58) Field of Classification Search  
USPC .............. 438/22, 34, 45, 48, 767, 69, 82; 257/E21.043, E21.046, E21.057, 257/E21.085, E21.217, E21.09, E21.294

See application file for complete search history.

(56) References Cited

U.S. PATENT DOCUMENTS

| | | | |
|---|---|---|---|
| 5,696,784 A | 12/1997 | Srinivasan et al. | |
| 6,055,258 A | 4/2000 | Beyea et al. | |
| 6,931,043 B2 | 8/2005 | Connolly et al. | |
| 7,335,920 B2 | 2/2008 | Denbaars et al. | |
| 2004/0227142 A1* | 11/2004 | Izumiya | 257/79 |
| 2007/0145391 A1 | 6/2007 | Baik et al. | |
| 2008/0254563 A1* | 10/2008 | Hanamaki et al. | 438/47 |
| 2009/0003396 A1* | 1/2009 | Codato et al. | 372/26 |
| 2009/0127564 A1* | 5/2009 | Irikura et al. | 257/76 |
| 2009/0127580 A1 | 5/2009 | Hahn et al. | |
| 2009/0309124 A1 | 12/2009 | Wu et al. | |
| 2010/0038674 A1 | 2/2010 | Chen et al. | |

FOREIGN PATENT DOCUMENTS

WO 0135506 A1 5/2001

* cited by examiner

*Primary Examiner* — Mohsen Ahmadi (57) ABSTRACT

An improved method of fabricating a vertical semiconductor LED is disclosed. Ions are implanted into the LED to create non-conductive regions, which facilitates current spreading in the device. In some embodiments, the non-conductive regions are located in the p-type layer. In other embodiments, the non-conductive layer may be in the multi-quantum well or n-type layer.

15 Claims, 8 Drawing Sheets

VERTICAL STRUCTURE LED CURRENT SPREADING BY IMPLANTED REGIONS

This application claims priority of U.S. Provisional Patent Application Ser. No. 61/319,425, filed Mar. 31, 2010, the disclosure of which is incorporated herein by reference in its entirety.

FIELD

This invention relates to ion implantation of light emitting diodes (LEDs) and, more particularly, to ion implantation of light emitting diodes to affect current spreading.

BACKGROUND

LEDs are built on a substrate and are doped with impurities to create a p-n junction. A current flows from the p-side, or anode, to the n-side, or cathode, but not in the reverse direction. Electrons and holes flow into the p-n junction from electrodes with different voltages. If an electron meets a hole, it falls into a lower energy level and releases energy in the form of a photon. The wavelength of the light emitted by the LED and the color of the light may depend on the band gap energy of the materials forming the p-n junction.

Figure 1:
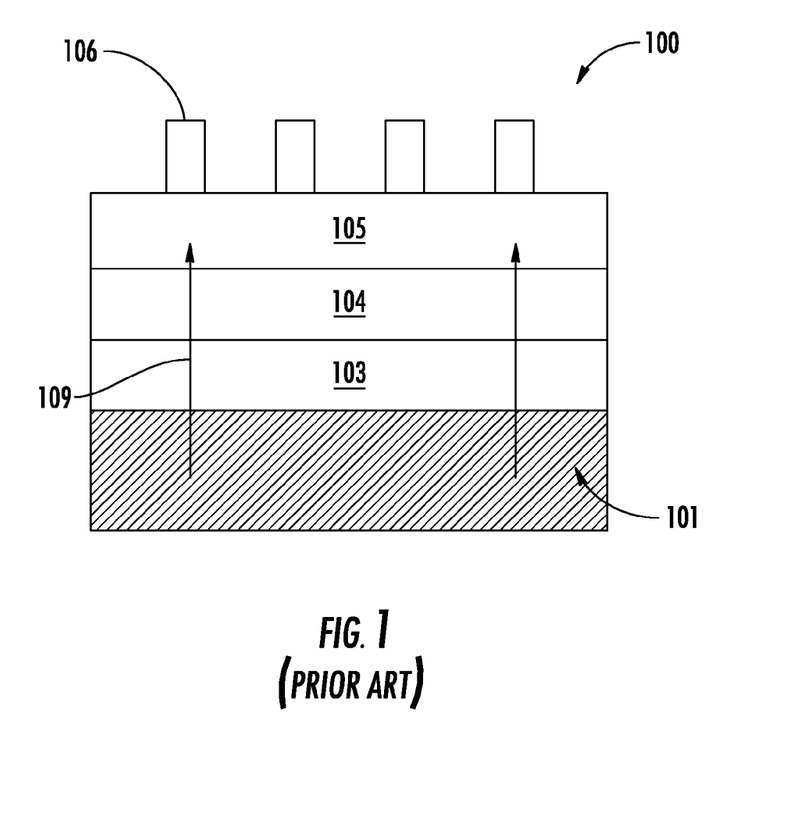
FIG. 1 is a cross-sectional side view of the vertical LED structure of the prior art.

FIG. 1 is a cross-sectional side view of a vertical LED structure. The LED 100 has a series of p electrodes (or p mirrors) 101 (illustrated in FIGS. 1-2 by the hash marks). These p electrodes 101 function as a p-ohmic contact and/or an optical reflection mirror. In other words, the p electrodes 101 serve to reflect light back toward the upper surface (i.e. above the n-type layer 105). In addition, these p electrodes serve as the electron source for the LED.

A p-type layer 103 is disposed on the p electrodes 101. A multiple quantum well (MQW) 104 is disposed on the p-type layer 103. An n-type layer 105 is disposed on the MQW 104. Finally, n electrodes 106 are disposed on the n-type layer 105. This LED 100 may be mounted on a metal alloy in one instance. The p-type layer 103 and n-type layer 105 may be, for example, GaN or AlGaInP. The MQW 104 may be GaInN or AlGaInP.

One shortcoming of this configuration is that the current preferably flows directly toward the n electrodes 106, as shown by arrows 109. This means that light is predominantly generated in areas within the LED which are blocked by the n electrodes 106.

Figure 2A:
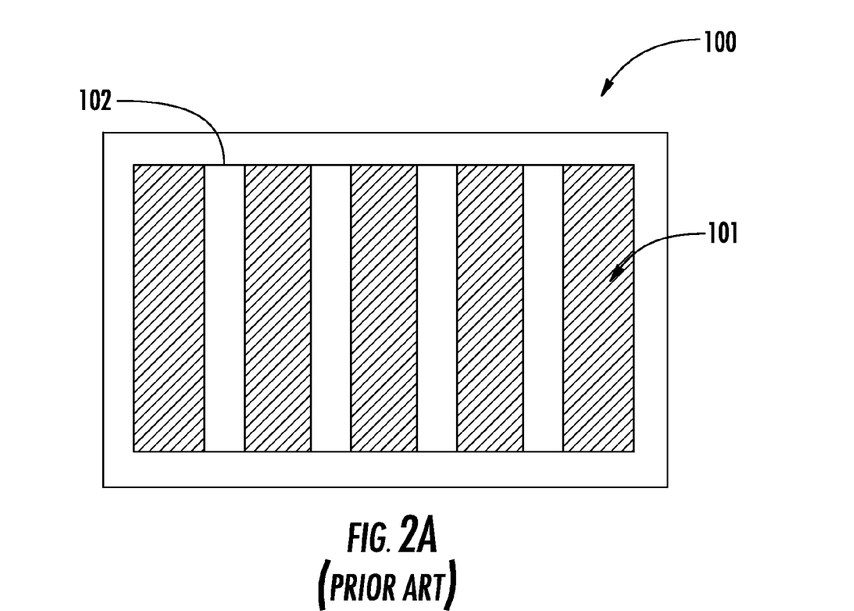
FIG. 2A is a bottom perspective view of a vertical LED structure of the prior art.
Figure 2B:
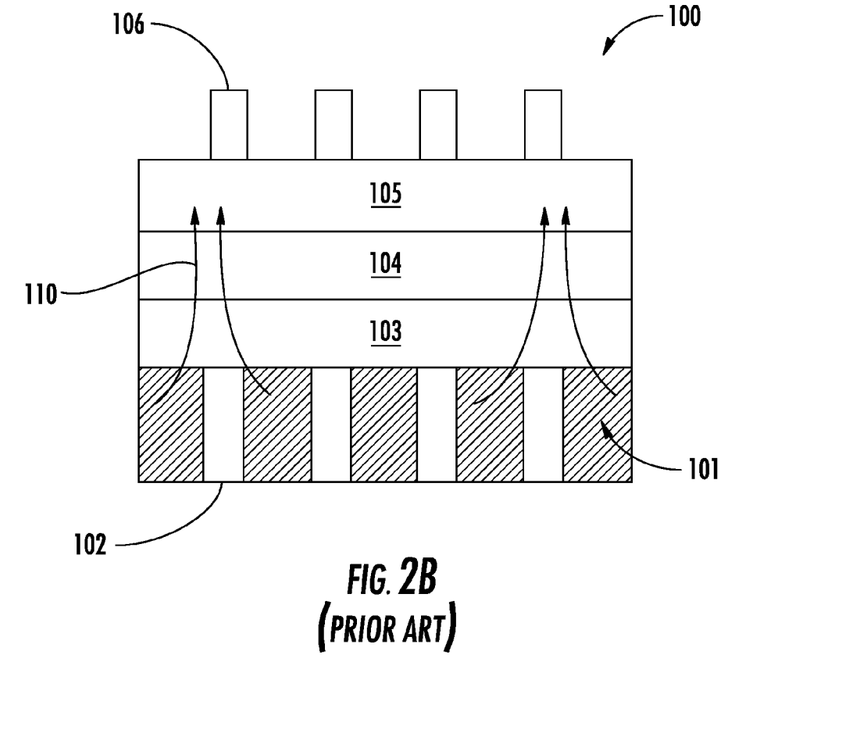
FIG. 2B is a cross-sectional side view of the vertical LED structure in FIG. 2A.

To overcome this shortcoming, several methods are used. In some embodiments, disruption strips 102 (illustrated in FIGS. 2A-B by shading) interrupt the p electrodes 101. FIG. 2A is a bottom (or p-side) perspective view of a vertical LED structure and FIG. 2B is a cross-sectional side view of the vertical LED structure in FIG. 1. The LED 100 has a series of p electrodes (or p mirrors) 101 (illustrated in FIGS. 1-2 by the hash marks). These p electrodes 101 function as a p-ohmic contact and/or an optical reflection mirror. The disruption strips 102 force a current to spread over the areas of the LED 100 that are not shadowed by the n electrodes 106, as shown by the arrows 110. Such current spreading may increase the efficiency and brightness of the LED 100. In some embodiment, these disruption strips 102 may be an oxide, which is non-conductive. In other embodiments, these disruption strips may connect to p-type layer 103 through non-ohmic contacts, which increases their resistivity.

Other techniques include coating portions of the lower surface of the p-type layer 103 with a dielectric material to disrupt the current flow. Another technique involves deposition of a dielectric on the lower surface of the p-type layer 103. However, these techniques are known to be susceptible to peeling.

Current spreading in the LED 100 increases the brightness of the LED 100 because any current concentration or light generation under the n electrodes 106 is reduced or eliminated. Furthermore, spreading a current over the entire device area of the LED 100 may increase excitation efficiency. Disruption of the p electrodes 101, however, sacrifices optical reflection from the side of the LED 100 with the p-type layer 103 because the optical reflection will be reduced as the area of the p electrodes 101 is reduced. Thus, reducing the area of the p electrodes 101 will reduce reflection or mirroring. Interrupting the p electrodes 101 may cause a significant brightness loss in one instance.

Vertical LED structures have optical reflection problems. Accordingly, there is a need in the art for an improved vertical LED structure and a method of ion implantation to form an improved vertical LED structure.

SUMMARY

An improved method of fabricating a vertical semiconductor LED is disclosed. Ions are implanted into the LED to create non-conductive regions, which facilitates current spreading in the device. In some embodiments, the non-conductive regions are located in the p-type layer. In other embodiments, the non-conductive layer may be in the multi-quantum well or n-type layer.

BRIEF DESCRIPTION OF THE DRAWINGS

For a better understanding of the present disclosure, reference is made to the accompanying drawings, which are incorporated herein by reference and in which.

DETAILED DESCRIPTION

The method is described herein in connection with ion implantation of LEDs. However, the method can be used with other semiconductor manufacturing processes. A beam-line ion implanter, plasma doping ion implanter, or other ion implantation system known to those skilled in the art may be used in the embodiments described herein. Thus, the invention is not limited to the specific embodiments described below.

Figure 3:
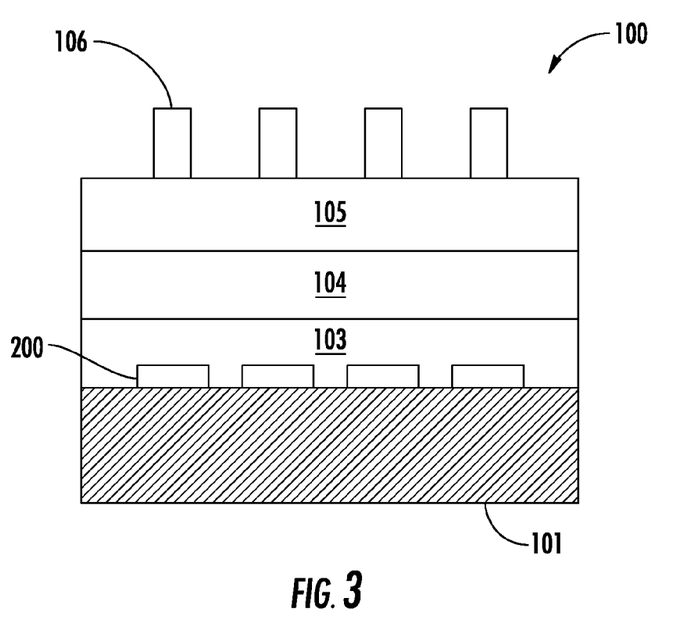
FIG. 3 is a cross-sectional side view of a first embodiment of an improved vertical LED structure.
Figure 4A:
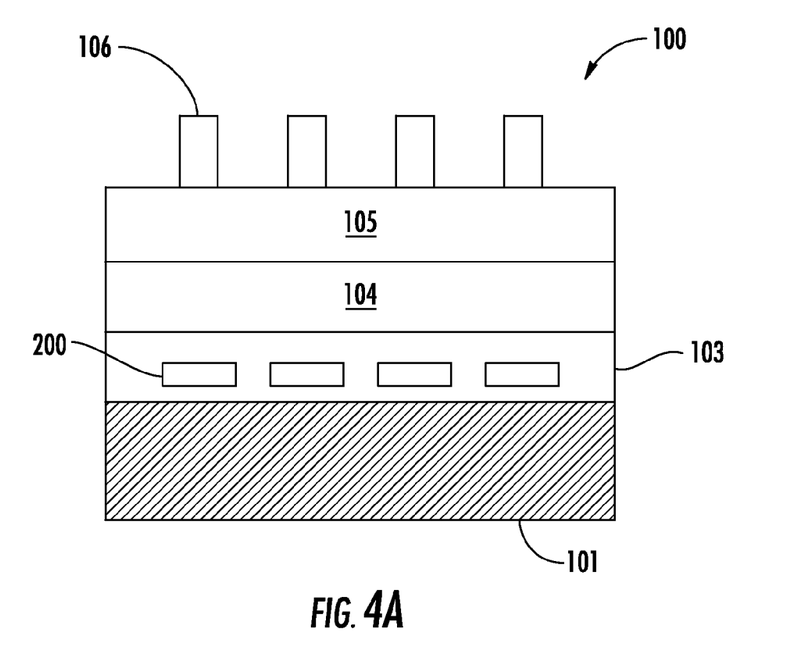
FIGS. 4A-D are cross-sectional side views of other embodiments.
Figure 4B:
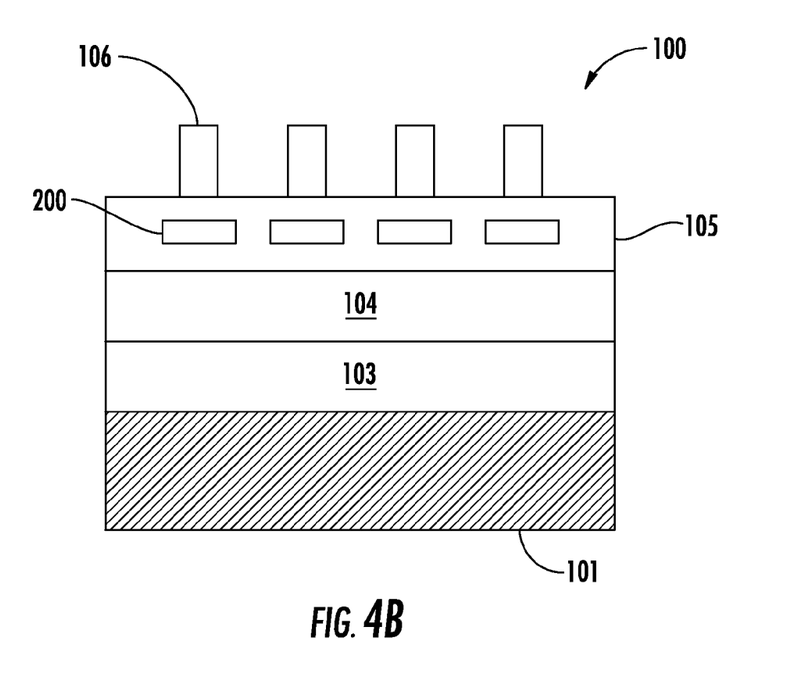
Figure 4C:
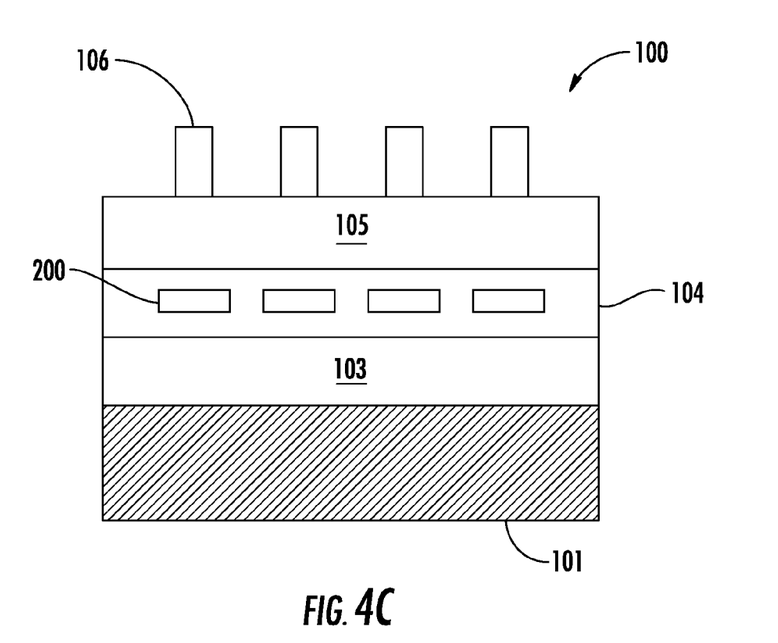
Figure 4D:
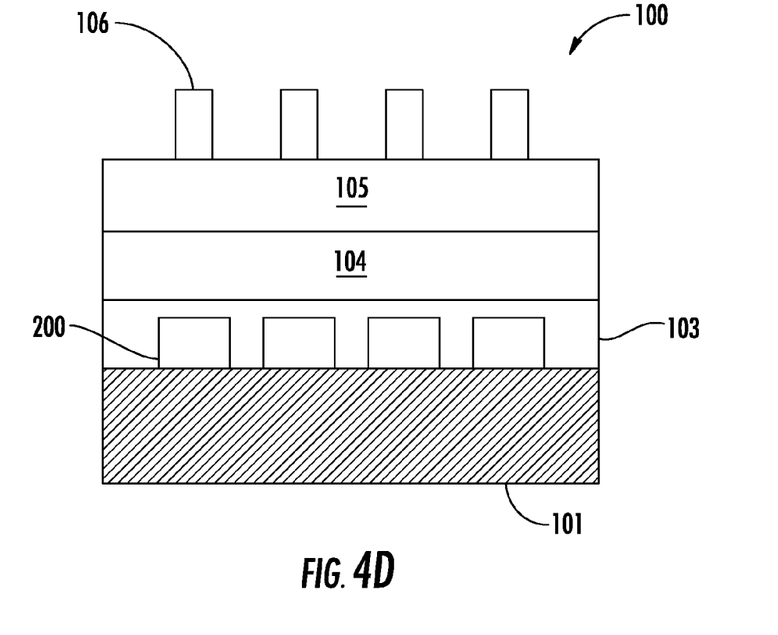

FIG. 3 is a cross-sectional side view of a first embodiment of an improved vertical LED structure. A series of implanted regions 200 have been formed beneath the n electrodes 106 within the p-type layer 103. The disruption strips 102 also have been removed. While the implanted regions 200 in FIG. 3 are illustrated as wider than the n electrodes 106, the dimensions of the implanted regions 200 may vary. In another instance, the implanted regions 200 are the same width as or narrower than the n electrodes 106. The implanted regions 200 are preferably aligned with the n electrodes 106. These implanted regions 200 function as a current blocking layer and may force a current to spread over the areas of the LED 100 that are not shadowed by the n electrodes 106. However, the implanted regions 200 do not interrupt the mirror function of the p electrode 101. The p electrode 101 is now a solid layer across the LED 100 and optical loss is reduced because the p electrode 101 is not interrupted. These implanted regions 200 are optically transparent but electrically isolated and may force current spreading to occur. While the implanted regions 200 are illustrated in FIG. 3 as disposed on the p electrodes 101, the implanted regions 200 may be disposed elsewhere within the p-type layer 103 or LED 100. FIGS. 4A-D show various embodiments. FIG. 4A shows a second embodiment, where the implanted regions are in the middle of the p-type layer 103. FIG. 4B shows an embodiment where the implanted regions are within the n-type layer 105. FIG. 4C shows an embodiment where the implanted regions are within the MQW 104. FIG. 4D shows chained implants, wherein the implanted regions 200 are in a desired profile rather than those of the previous embodiments. These implanted regions 200 are non-conductive and therefore force the current to spread so as to avoid these implanted regions. The implanted regions 200 may be at the top of the p-type layer, in the middle of the p-type layer, at the bottom of the p-type layer, or within the entire layer or a substantial portion of the p-type layer. Similarly, the implanted regions 200 may occupy any position within the MQW or the n-type layer. Thus, the depth of the implanted regions 200 is not limited by the disclosure. Similarly, the width of the implanted regions 200 and the thickness of the implanted regions 200 are not limited by the disclosure.

The implanted regions 200 may be formed by ion implantation of species such as, for example, N, H, He, O, Si, Ar, Ge, or other species known to those skilled in the art. The implanted regions 200 also may be formed using an n-type dopant such as P, As, or Sb. A stencil or shadow mask, hard mask, oxide layer, or photoresist may be used to selectively implant these species in particular regions of the LED 100. Thus, the species may only be implanted into the implanted regions 200 and not the rest of the LED 100. This may be a patterned or selective implant.

Figure 5A:
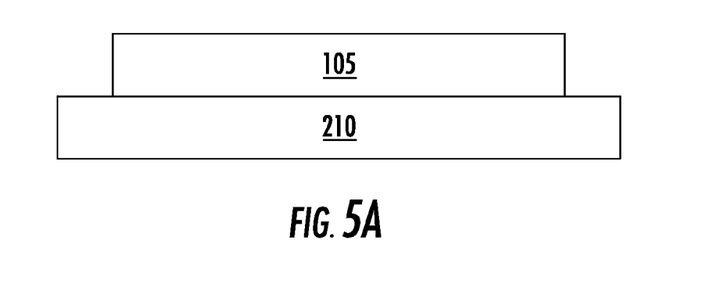
FIGS. 5A-G illustrate a manufacturing sequence according to one embodiment.

FIGS. 5A-G show a sequence of steps that can be used to create a green or blue or UV LED 100. In FIG. 5A, the n-type layer 105 is grown on a suitable substrate 210. This substrate may be sapphire, silicon carbide, aluminum nitride, GaN or silicon. The n-type layer 105 is preferably grown on the substrate using metalorganic chemical vapor deposition (MOCVD) or molecular beam expitaxy (MBE). The n-type layer 105 may be GaN or AlGaN, which is doped with n type dopants, such as silicon. The n-type layer may be grown to a thickness of between 100 nm to tens of microns.

Figure 5B:
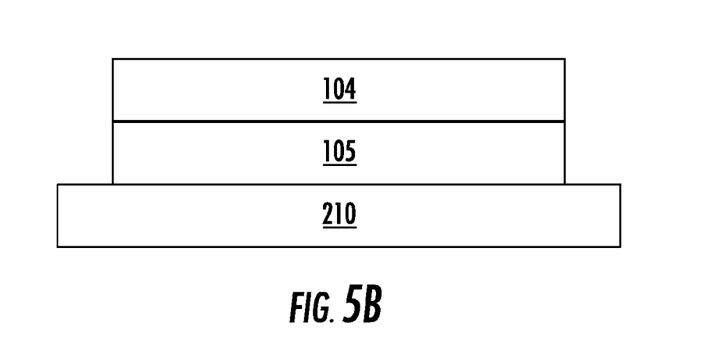

After the n-type layer 105 has been grown, the MQW 104 is grown, as shown in FIG. 5B. In some embodiments, the MQW 104 comprises GaInN or AlGaN. The MQW 104 is typically grown using MOCVD. The thickness of the MQW 104 is between tens of nanometers and 2 microns.

Figure 5C:
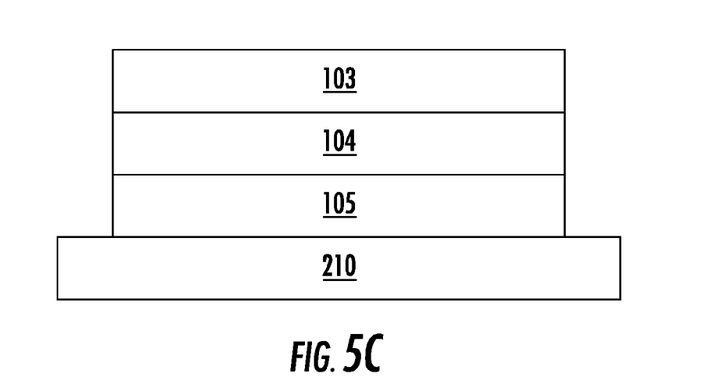

Following the MQW 104 layer has been grown, the p-type layer 105 is grown as shown in FIG. 5C. The p-type layer 103 may be GaN or AlGaN, which is grown in the presence of a p type dopants, such as Mg or Zn. The p-type layer may be grown to a thickness of between 50 nm and 2 microns.

Figure 5D:
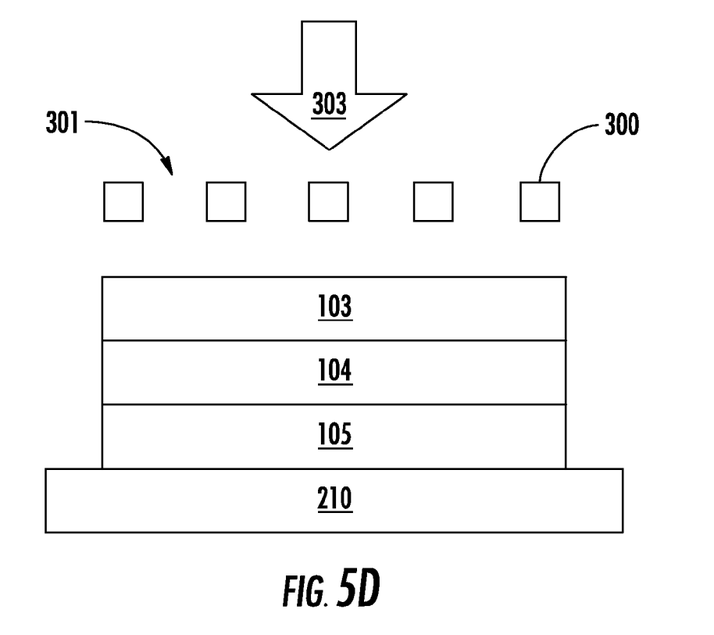
Figure 5E:
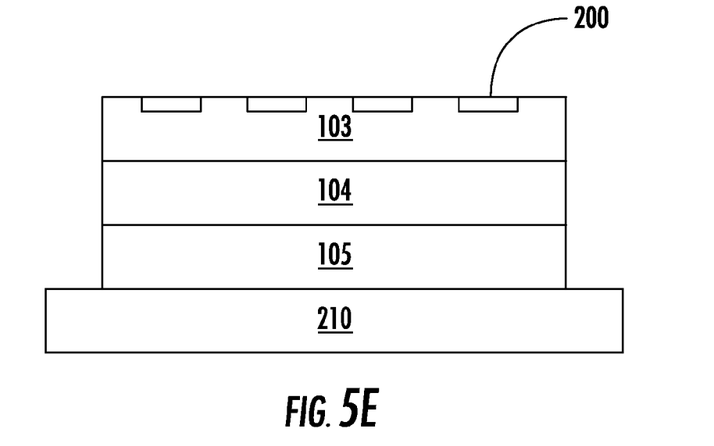

After the p-type layer is grown, the device is subjected to an ion implantation process, as shown in FIG. 5D. In some embodiments, a mask 300 with apertures 301 is positioned in the path of the ions 303, so as to block a portion of the ions 303. In other embodiments, photoresist, oxide layers, stencil masks, shadow masks or other masking techniques may be employed to create the patterned implant. The ions implant the p-type layer 103 and create an implanted region 200, as shown in FIG. 5E. The thickness of the implanted region may be equal to or less than that of the p-type layer 103. In some embodiments, nitrogen is used as the implanted ion.

FIG. 5E shows the result using an implant energy adapted to implant the surface of the p-type layer 103. In other embodiments, other implant energies are used. For example, a greater implant energy would cause the implanted regions to be located deeper in the p-type layer 103. Even greater implant energies may be used to cause the implanted regions to be located in the MQW 104 or the n-type 105, as shown in FIGS. 4A-C.

The implant pattern shown in FIG. 4D can be created by using a range of implant energies, thereby allowing the ions to be implanted at various depths in the LED 100.

The implanted regions do not conduct current as well as the surrounding p-type layer 102. In some embodiments, ions are implanted which damage the crystalline structure and affect the conductivity of the region. These may be referred to as isolation regions. In other embodiments, n-type dopants are implanted which reduce the conductivity of the p-type material in the implanted region 200. In some embodiments, the implanted region has no residual conductivity, while in other embodiments, it becomes n-doped. In either embodiment, the result is that the implanted regions 200 have lower conductivity than the surrounding material.

Figure 5F:
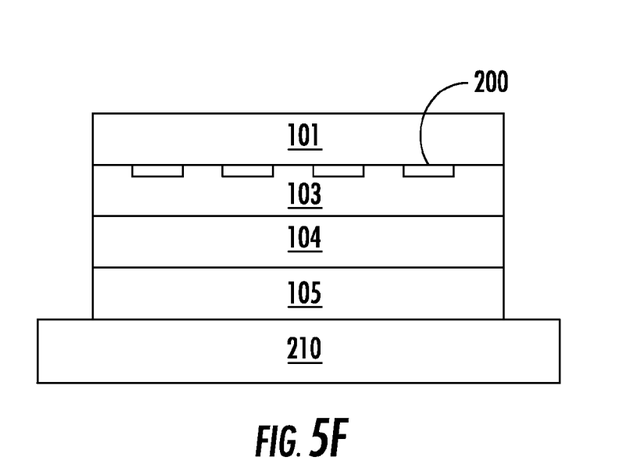

After the implanted regions 200 are created, the p electrode 101 is added to the stack, as shown in FIG. 5F. In some embodiments, silver is applied to the p-type layer 101. Subsequent layers of metal, such as silver, can be applied using evaporation or electroplating. After the p electrode 101 can be applied, the LED 100 is removed from the substrate 200, such as by laser liftoff.

Figure 5G:
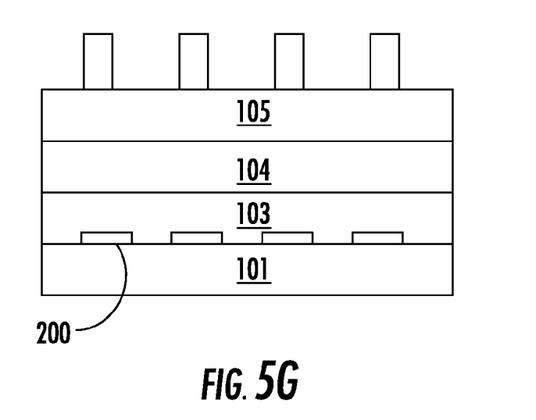

Finally, n electrodes 106 are formed on the n-type layer 105, as shown in FIG. 5G.

Although the above sequence describes the implantation occurring after the p-type layer 103 has been grown, the disclosure is not limited to this embodiment. In some embodiments, the implantation can be performed after the n-type layer 105 is grown, but before the growth of the MQW 104. In other embodiments, the implantation is performed after the MQW 104 is grown, but before the growth of the p-type layer 103.

The creation of red LEDs is performed in a similar manner. In this embodiment, the p-type layer 103 and the n-type layer may be appropriately doped AlGaInP. The MQW 104 may also comprise AlGaInP, with the elements configured with various atomic ratios. In addition, although other species may be used, the ion implantation of a red LED may be performed using hydrogen or argon.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of fabricating a vertical light emitting diode (LED), comprising:
   growing an n-type layer on a substrate;
   growing a multi-quantum well (MQW) on said n-type layer;
   growing a p-type layer on said MQW; then
   selectively implanting ions into one of said n-type layer, MQW and directly after p-type layer so as to create regions of non-conductivity having a first width;
   applying a metal to said p-type layer to create a p electrode; then
   removing said LED from said substrate; then
   applying n electrodes having a second width less than the first width on said n-type layer;
   wherein said regions of non-conductivity having a first width are aligned with said n electrodes and are located on the top of said p-type layer, nearest said p electrode.

2. The method of claim 1, wherein said n-type layer is grown in an environment comprising GaN doped with an n-type dopant.

3. The method of claim 1, wherein said p-type layer is grown in an environment comprising GaN doped with a p-type dopant.

4. The method of claim 1, wherein said MQW is grown in an environment comprising GaInN or AlGaN.

5. The method of claim 1, wherein said ions are selected from the group consisting of N, H, He, 0, Si, Ar, Ge, P, As, and Sb.

6. The method of claim 1, wherein said region of non-conductivity is located in said p-type layer.

7. The method of claim 1, wherein said region of non-conductivity is located in said n-type layer.

8. The method of claim 1, wherein said regions of non-conductivity are located at the bottom of said p-type layer, nearest said MQW.

9. The method of claim 1, wherein said regions of non-conductivity are located in the middle of said p-type layer.

10. The method of claim 1, wherein said n-type layer is grown in an environment comprising AlGaInP doped with an n-type dopant.

11. The method of claim 10, wherein said p-type layer is grown in an environment comprising AlGaInP doped with a p-type dopant.

12. The method of claim 11, wherein said MQW is grown in an environment comprising AlGaInP with various atomic ratios.

13. The method of claim 12, wherein said ions are selected from the group consisting of N, H, He, 0, Si, Ar, Ge, 25P, As, and Sb.

14. The method of claim 1, wherein said LED emits green or blue or UV light and wherein said n-type layer is grown in an environment comprising GaN doped with an n-type dopant, said p-type layer is grown in an environment comprising GaN doped with a p-type dopant, said MQW is grown in an environment comprising GaInN or AlGaN and said ions comprise nitrogen.

15. The method of claim 1, wherein said LED emits red light and wherein said n-type layer is grown in an environment comprising AlGaInP doped with an n-type dopant, said p-type layer is grown in an environment comprising AlGaInP doped with a p-type dopant, said MQW is grown in an environment comprising AlGaInP with various ratios and said ions comprise hydrogen or argon.

* * * * *